(12) United States Patent
Mankin et al.

(10) Patent No.: US 10,026,822 B2
(45) Date of Patent: Jul. 17, 2018

(54) FABRICATION OF NANOSCALE VACUUM GRID AND ELECTRODE STRUCTURE WITH HIGH ASPECT RATIO DIELECTRIC SPACERS BETWEEN THE GRID AND ELECTRODE

(71) Applicant: Elwha LLC, Bellevue, WA (US)

(72) Inventors: Max N. Mankin, Seattle, WA (US); Tony S. Pan, Bellevue, WA (US)

(73) Assignee: ELWHA LLC, Bellevue, WA (US)

( * ) Notice: Subject to any disclaimer, the term of this patent is extended or adjusted under 35 U.S.C. 154(b) by 0 days.

(21) Appl. No.: 14/939,743

(22) Filed: Nov. 12, 2015

(65) Prior Publication Data
US 2016/0141382 A1    May 19, 2016

Related U.S. Application Data

(60) Provisional application No. 62/080,073, filed on Nov. 14, 2014.

(51) Int. Cl.
| | |
|---|---|
| H01J 9/14 | (2006.01) |
| H01L 29/45 | (2006.01) |
| H01J 1/46 | (2006.01) |
| H01J 1/48 | (2006.01) |
| H01L 21/02 | (2006.01) |
| H01L 21/311 | (2006.01) |
| H01L 21/3213 | (2006.01) |
| H01L 29/167 | (2006.01) |
| H01L 29/417 | (2006.01) |

(52) U.S. Cl.
CPC .............. *H01L 29/456* (2013.01); *H01J 1/46* (2013.01); *H01J 1/48* (2013.01); *H01J 9/14* (2013.01); *H01L 21/0217* (2013.01); *H01L 21/02164* (2013.01); *H01L 21/02178* (2013.01); *H01L 21/02181* (2013.01); *H01L 21/31111* (2013.01); *H01L 21/32133* (2013.01); *H01L 29/167* (2013.01); *H01L 29/417* (2013.01)

(58) Field of Classification Search
CPC .... H01J 1/46–1/48; H01J 2329/46–2329/4695
See application file for complete search history.

(56) References Cited

U.S. PATENT DOCUMENTS

| | | | |
|---|---|---|---|
| 4,200,555 A | 4/1980 | Joy et al. | |
| 5,404,070 A * | 4/1995 | Tsai | H01J 9/025 313/309 |
| 5,587,588 A * | 12/1996 | Kim | H01J 1/3042 257/10 |
| 5,727,976 A * | 3/1998 | Nakamoto | H01J 21/105 310/334 |
| 5,865,657 A | 2/1999 | Haven et al. | |
| 6,031,250 A * | 2/2000 | Brandes | H01J 1/3042 257/77 |

(Continued)

OTHER PUBLICATIONS

PCT International Search Report; International App. No. PCT/US2015/060384; dated Feb. 22, 2016; pp. 1-5.

*Primary Examiner* — Mariceli Santiago

(57) ABSTRACT

Some embodiments of vacuum electronics call for a grid that is fabricated in close proximity to an electrode, where, for example, the grid and electrode are separated by nanometers or microns. Methods and apparatus for fabricating a nanoscale vacuum grid and electrode structure are described herein.

22 Claims, 11 Drawing Sheets

(56) References Cited

U.S. PATENT DOCUMENTS

| | | | |
|---|---|---|---|
| 6,670,629 B1 * | 12/2003 | Wilson .................. | H01J 1/3044 257/10 |
| 8,575,842 B2 | 11/2013 | Hyde et al. | |
| 2004/0198850 A1 | 10/2004 | Connor et al. | |
| 2005/0224779 A1 | 10/2005 | Wang et al. | |
| 2007/0120482 A1 | 5/2007 | Michael et al. | |
| 2009/0189138 A1 | 7/2009 | Lung et al. | |

* cited by examiner

FIG. 8

| 802 |
|---|
| 108 |
| 802 |
| 108 |
| 106 |
| 104 |
| 102 |

FABRICATION OF NANOSCALE VACUUM GRID AND ELECTRODE STRUCTURE WITH HIGH ASPECT RATIO DIELECTRIC SPACERS BETWEEN THE GRID AND ELECTRODE

If an Application Data Sheet (ADS) has been filed on the filing date of this application, it is incorporated by reference herein. Any applications claimed on the ADS for priority under 35 U.S.C. §§ 119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications or claims benefits under 35 USC § 119(e) for provisional patent applications, for any and all parent, grandparent, great-grandparent, etc. applications of the Priority Application(s)).

PRIORITY APPLICATIONS

The present application claims benefit of priority of United States Provisional Patent Application No. 62/080,073, entitled FABRICATION OF NANOSCALE VACUUM GRID AND ELECTRODE STRUCTURE WITH HIGH ASPECT RATIO DIELECTRIC SPACERS BETWEEN THE GRID AND ELECTRODE, naming MAX N. MANKIN AND TONY S. PAN as inventors, filed 14 Nov. 2014, which was filed within the twelve months preceding the filing date of the present application or is an application of which a currently co-pending priority application is entitled to the benefit of the filing date.

If the listings of applications provided above are inconsistent with the listings provided via an ADS, it is the intent of the Applicant to claim priority to each application that appears in the Domestic Benefit/National Stage Information section of the ADS and to each application that appears in the Priority Applications section of this application.

All subject matter of the Priority Applications and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

SUMMARY

In one embodiment, a method of fabricating a device having an electrode and a grid comprises: depositing a first material on a substrate to form the electrode, wherein the electrode forms an etch stop for an etchant; depositing a second material, different from the first material, on the electrode, wherein the second material includes a dielectric; depositing and patterning a third material on the second material, wherein the patterned third material forms the grid; and etching the second material with the etchant to pattern the second material such that a pattern of the second material is defined by a pattern of the grid.

In one embodiment, a method of fabricating a device having an electrode and a grid comprises: depositing a first material on an electrode, wherein the first material includes a dielectric, and wherein the electrode forms an etch stop for an etchant; depositing and patterning a second material on the first material, wherein the patterned second material forms the grid; and etching the first material with the etchant to pattern the first material such that a pattern of the first material is defined by a pattern of the grid.

In one embodiment, a multi-layer electrode-grid structure comprises: a substrate; a layer of a first material on the substrate, the layer of the first material forming an electrode; a layer of a second material on the first material, the second material including a dielectric; and a patterned layer of a third material on the second material, the patterned layer of the third material forming a grid, wherein the second material is etched such that a pattern of the second material is defined by a pattern of the grid.

In one embodiment, a method of fabricating a device having an electrode and a grid comprises: depositing a first material on a substrate to form the electrode; depositing a second material, different from the first material, on the electrode, wherein the second material includes a dielectric; depositing and patterning a third material on the second material, wherein the patterned third material forms the grid; and etching the second material with the etchant to pattern the second material such that a pattern of the second material is defined by a pattern of the grid, wherein the etched second material has a height and a width, and wherein the ratio of the height to the width is substantially between 2/1 and 50/1.

In one embodiment, a method of fabricating a device having an electrode and a grid comprises: depositing a first material on a substrate to form the electrode; depositing an etch stop material, different from the first material, on the electrode, wherein the etch stop material forms an etch stop for an etchant; depositing a second material, different from the first material, on the etch stop, wherein the second material includes a dielectric; depositing and patterning a third material on the second material, wherein the patterned third material forms the grid; and etching the second material with the etchant to pattern the second material such that a pattern of the second material is defined by a pattern of the grid.

In one embodiment, a method of fabricating a device having an electrode and a grid comprises: depositing a first material on a substrate to form the electrode; depositing a resist on the first material in a first set of regions on the electrode, wherein the resist defines a second set of regions proximate to the electrode that are not occupied by the resist; depositing a second material on the electrode, in the second set of regions, wherein the second material includes a dielectric; depositing a third material on the second material, in the second set of regions, wherein the third material forms the grid; and removing the resist.

In one embodiment, a method of fabricating a device having an electrode and a grid comprises: depositing a first material on a substrate to form the electrode, wherein the electrode forms an etch stop for an etchant; depositing a second material, different from the first material, on the electrode, wherein the second material includes a dielectric; depositing and patterning a third material on the second material; etching the second material with the etchant to pattern the second material such that a pattern of the second material is defined by a pattern of the third material; and placing a grid on the second material.

In one embodiment, a method of fabricating a device having an electrode and multiple grids comprises: depositing a first material on a substrate to form the electrode, wherein the electrode forms an etch stop for an etchant; depositing alternating layers of dielectric and conductor, concluding with a top conductive layer; patterning the top conductive layer, wherein the top conductive layer forms a grid; and etching the alternating layers of dielectric and conductor such that a pattern of the layers of dielectric and conductor is defined by a pattern of the top conductive layer.

In one embodiment, an apparatus having an electrode and multiple grids comprises: a layer of a first material on the substrate, the layer of the first material forming an electrode; alternating layers of dielectric and conductor; and wherein a conductor forms the top layer, and wherein the top layer is patterned to form a grid, and wherein the alternating layers of dielectric and conductor are patterned such that a pattern of the layers of dielectric and conductor is defined by a pattern of the top layer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

FIG. 8 is a schematic of a structure having multiple layers of dielectric and conductor.

DETAILED DESCRIPTION

Figure 1:
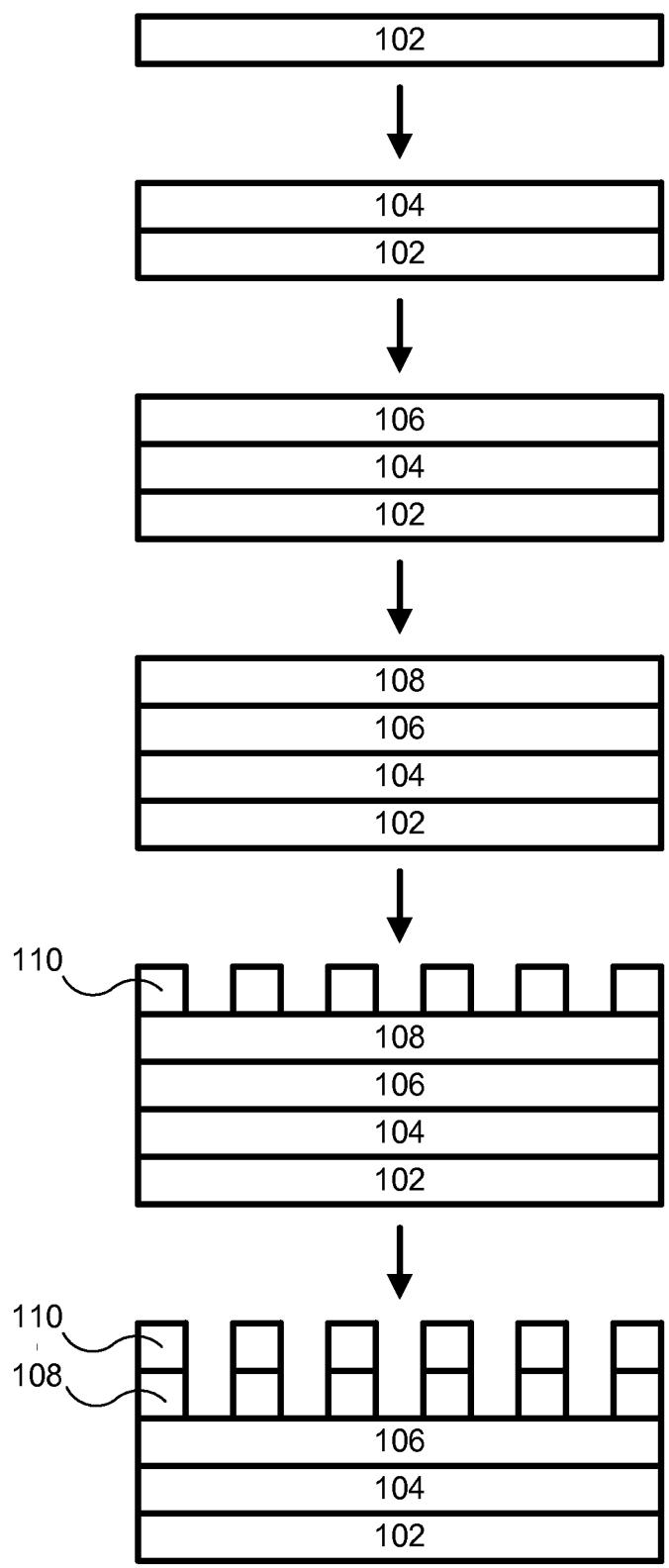
FIG. 1 is a flow describing a process for fabricating the vacuum grid electrode structure described herein.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Some embodiments of vacuum electronics call for a grid that is fabricated in close proximity to an electrode (i.e. an electrode-grid structure), where, for example, the grid and electrode are separated by nanometers or microns. One example of such an embodiment is described in U.S. Pat. No. 8,575,842 to Hyde et al. entitled FIELD EMISSION DEVICE, which is incorporated herein by reference. The electrode may be a cathode or an anode in different embodiments, and the grid is typically made of a conductive material such it can vary the electric potential of a charged particle traveling near it. Methods and apparatus for fabricating an electrode-grid structure are described herein.

In one embodiment of a fabrication process, a flow of which is illustrated in FIG. 1, an adhesion layer 104 is fabricated on a substrate 102. Next, an electrode 106 is fabricated on the adhesion layer, and a dielectric layer 108 is deposited on the electrode. An etch mask 110 (which, in some embodiments, forms the grid) is fabricated on the dielectric layer, and an etch is performed to remove the portions of the dielectric layer that are not covered by the etch mask. Although the layers 102-110 are shown as having substantially the same thicknesses, each layer thicknesses will vary according to a particular embodiment.

Figure 2:
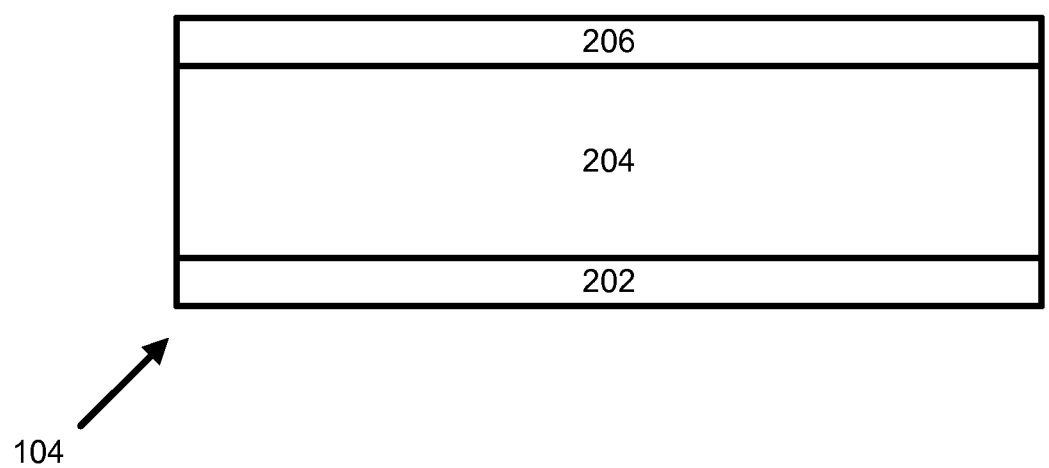
FIG. 2 is a schematic of sublayers of an adhesion layer.

In some embodiments the adhesion layer 104 comprises a number of sublayers, as shown in FIG. 2. In this embodiment, the sublayers include: (202) 20 nm of titanium (Ti), (204) 80 nm of copper (Cu), and (206) 20 nm of titanium (Ti). In this embodiment, the two titanium layers served as adhesion layers and the copper layer serves as an additional conductive layer/carrier source/sink.

One exemplary embodiment of a fabrication process of an electrode-grid structure 100 is as follows. First, a substrate 102 is prepared, where in this embodiment the substrate is a degenerately $n^{++}$ As-doped Si wafer whose native oxide had been removed via in-situ $Ar^+$ sputtering. In some embodiments the substrate may be prepared (i.e., the native oxide may be removed, and/or the substrate may be cleaned) via standard semiconductor cleaning and/or oxide removal techniques such as RCA cleaning, ultrasonic agitation and/or rinsing in various solvents or water, HF or BHF etching, and/or sputtering the oxide away in-situ before deposition.

Sublayers 202-206 are sputtered onto the substrate 102. Then 80 nm of lanthanum hexaboride ($LaB_6$) is sputtered onto the last sublayer 206, where the lanthanum hexaboride forms the electrode (106). In some embodiments, all of the foregoing layers and sublayers are sputter deposited in the same multi-target Lesker Lab 18 sputter coater high-vacuum chamber in order to minimize contamination or impurity deposition between the layers and sublayers. As examples of exemplary conditions, titanium, copper, and lanthanum hexaboride may be magnetron sputtered in $Ar^+$ plasma at 200-250 W DC power at 5-20 mTorr pressure.

Next, for the dielectric layer 108, 500 or 1500 nm of silicon nitride ($Si_3N_4$) is deposited in a plasma-enhanced CVD (PECVD) with substrate temperature of 350° C. Then, to create the etch mask 110, electron beam or photolithography followed by evaporation of aluminum (Al) is used to additively define a 60 or 110 nm thick Ti/Al (10/50 or 10/100 nm) etch mask structure with 50 or 3000 nm wide lines spaced at a pitch of 500 or 6000 nm. Finally, an anisotropic vertical fluoride etch ($CHF_3:O_2$=26:1 sccm; 5 mTorr total pressure; 10° C.; 2250 W forward ICP power; 25 W forward RF power) is used to etch the dielectric layer 108, which in this embodiment is silicon nitride, where the aluminum forms the etch mask 110.

The size and thickness of each feature mentioned above is meant to be illustrative, and not limiting. Similarly, process parameters such as power, pressure, temperature, chemical ratios, and method of subtractively or additively defining or depositing the grid and/or etch mask mentioned above is meant to be illustrative, but not limiting. The chemistry, power, and temperature of the anisotropic etch can be adjusted to etch higher or lower aspect ratio structures, to etch at a different rate, and or to selectively etch different materials.

In some embodiments, the adhesion layer 104 may be a different material or combination of materials than that described above. For example, the adhesion layer may include conductive ceramics, transparent conductive oxides, metals, or other materials. Further, the adhesion layer may have a different total number of sublayers than what is described above, and the sublayers may have different thicknesses than what is described above. In some embodiments the adhesion layer may be eliminated entirely. In some embodiments the adhesion layer may be deposited via evaporation, atomic layer deposition (ALD), chemical vapor deposition (CVD), or via another process. Further, although the sublayers of the adhesion layer are described above as all being deposited together in the same chamber, in other embodiments it may be advantageous for the sublayers to be deposited separately.

In some embodiments the electrode 106 may comprise one or more different materials than previously described. For example, the electrode may be made of cerium hexaboride ($CeB_6$), tungsten (W), and/or diamond. The electrode may or may not be deposited in the same chamber as the adhesion layer.

In some embodiments the thickness of the dielectric layer 108 may be different from that described above, and/or the dielectric layer may include a different material or combination of materials than what has been described previously herein. For example, the dielectric layer may include silicon oxide, aluminum oxide, hafnium oxide, and/or other materials. Further, the method of depositing the dielectric is not limited to chemical vapor deposition, and other methods of depositing the dielectric include atomic layer deposition, evaporation, sputtering, and/or other methods.

Figure 3:
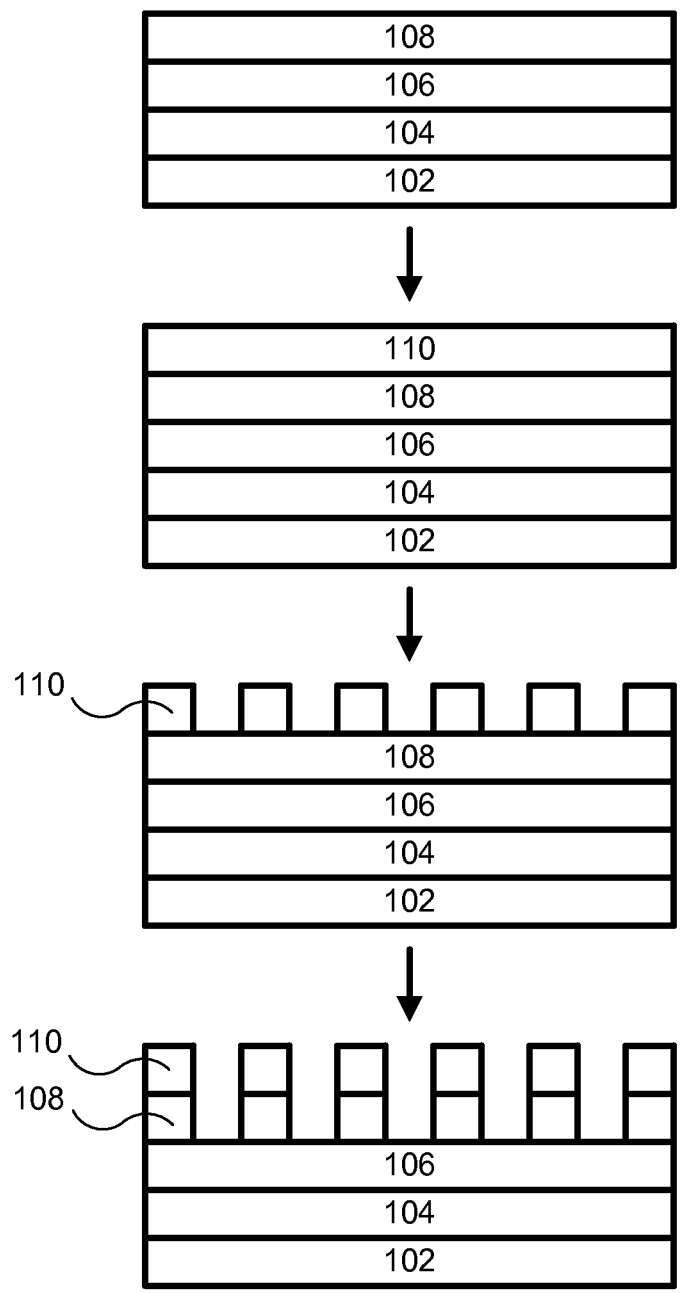
FIG. 3 is a flow describing a process for fabricating the vacuum grid electrode structure described herein.

In some embodiments the etch mask 110 may be deposited in a different way than that which is described above with respect to FIG. 1. For example, in one embodiment which is illustrated in FIG. 3 and may be summarized as a "subtraction process", fabrication of the etch mask 110 may include depositing an aluminum (Al) film and subsequently etching the deposited film in a particular lithographic pattern via (anisotropic) Al etching. (The first three deposition steps of FIG. 3 are the same as those of FIG. 1 and are omitted in FIG. 3 for brevity). In some embodiments, the etch mask forms the grid in the final device, and in other embodiments, which will be described herein, further fabrication steps are used to create the grid.

In some embodiments, contact pads and/or electrical interconnects (hereinafter, contacts) are fabricated to facilitate electrical connection to one or more conductive portions of the electrode-grid structure 100. For example, one embodiment of the fabrication of contacts on the grid is as follows. First, the native oxide on the area on which the contact will be formed is removed via in situ $Ar^+$ sputtering in the electron beam evaporator. Then, the contact is lithographically defined, and a conductor such as titanium (Ti)/aluminum (Al) (where the titanium (Ti) forms the adhesion layer for the conductor, aluminum (Al)) is deposited via electron beam evaporation.

In some embodiments a sacrificial protective layer is deposited on one or more regions of the electrode-grid structure 100 such that the region(s) on which the sacrificial protective layer is deposited is/are unaffected by later processing steps. In some embodiments the sacrificial protective layer is later removed, for example via an oxygen plasma etch, or via other means. The sacrificial protective layer may be removed before various process steps in which the grid needs to be exposed.

In one example of the use of a sacrificial protective layer to protect the grid, a double resist layer is deposited on an aluminum (Al) grid. The first layer of the double resist layer includes PMMA and the second layer of the double resist layer includes AZ. Contacts are then lithographically defined and developed, where the bottom (PMMA) layer protects the grid during this lithographic definition and development. In particular, without the PMMA layer, development of the AZ layer would etch the aluminum grid. Before depositing the contact on the grid, the PMMA layer is removed with an oxygen plasma.

In a second example of the use of a sacrificial protective layer to protect the grid, a resist is deposited on the grid during the etching of the dielectric layer.

Figure 4:
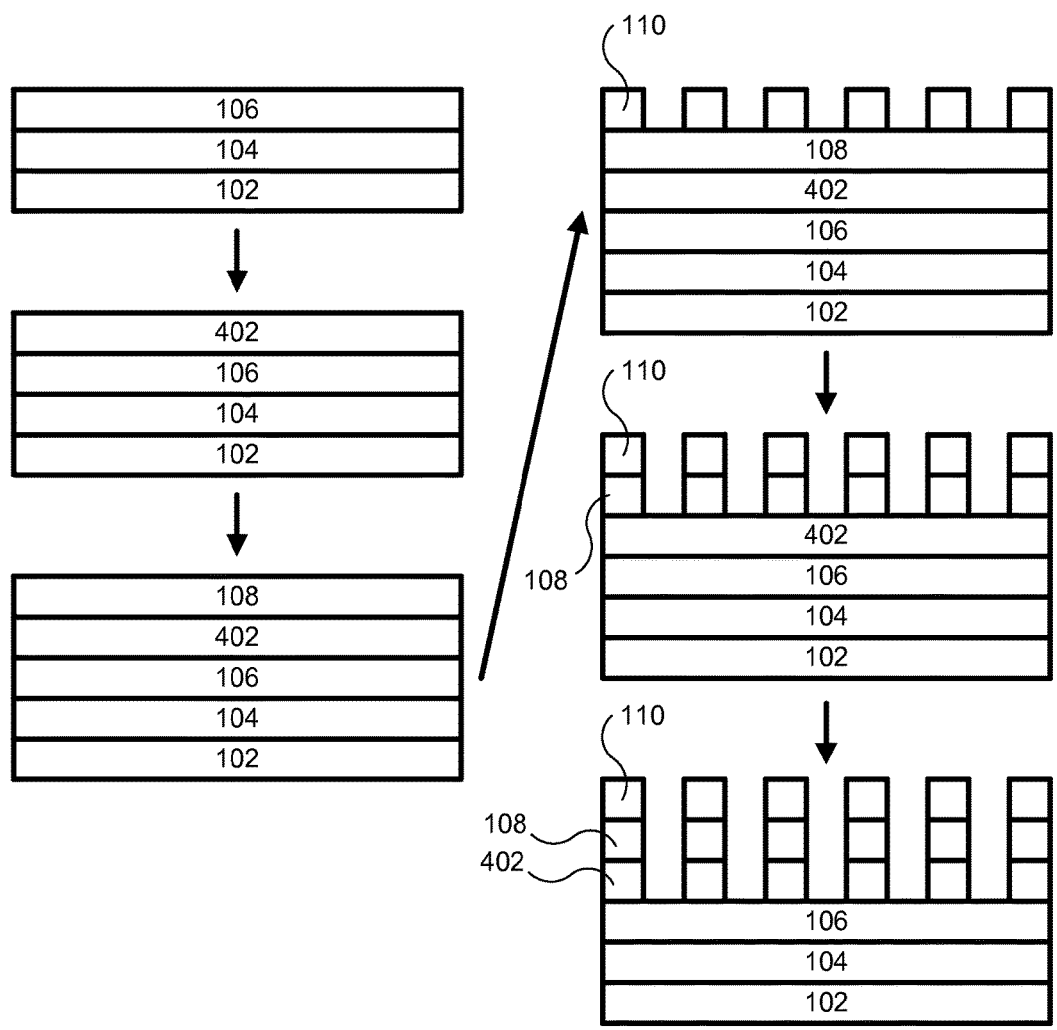
FIG. 4 is a flow describing a process for fabricating the vacuum grid electrode structure described herein.

In one embodiment of the fabrication of an electrode-grid structure 100, shown in FIG. 4, an etch stop layer 402 is deposited on the electrode (the first three deposition steps of FIG. 4 are the same as those of FIG. 1 and are omitted in FIG. 4 for brevity). This may be done, for example, to protect the electrode from the anisotropic etch, or in embodiments where the electrode material does not act as an etch stop. This etch stop layer 402 is removed in some embodiments with a second etch. In one embodiment where the electrode 106 does not act as an etch stop, the electrode 106 can be coated with aluminum (Al) which acts as the etch stop layer 402. The exposed portions of this etch stop layer 402 can then be removed at the end of the process with an anisotropic chlorine plasma Al etch process, which can be done after the dielectric layer 108 is etched.

In some embodiments the electrode-grid structure 100 is cleaned, at the end of the fabrication process or at a different time. In one embodiment an oxygen plasma barrel ash treatment is used to remove fluoro- or chloro-carbon polymers that are deposited on the dielectric sidewalls or the electrode, which may result from fluorine- or chlorine-based anisotropic etches.

Figure 5:
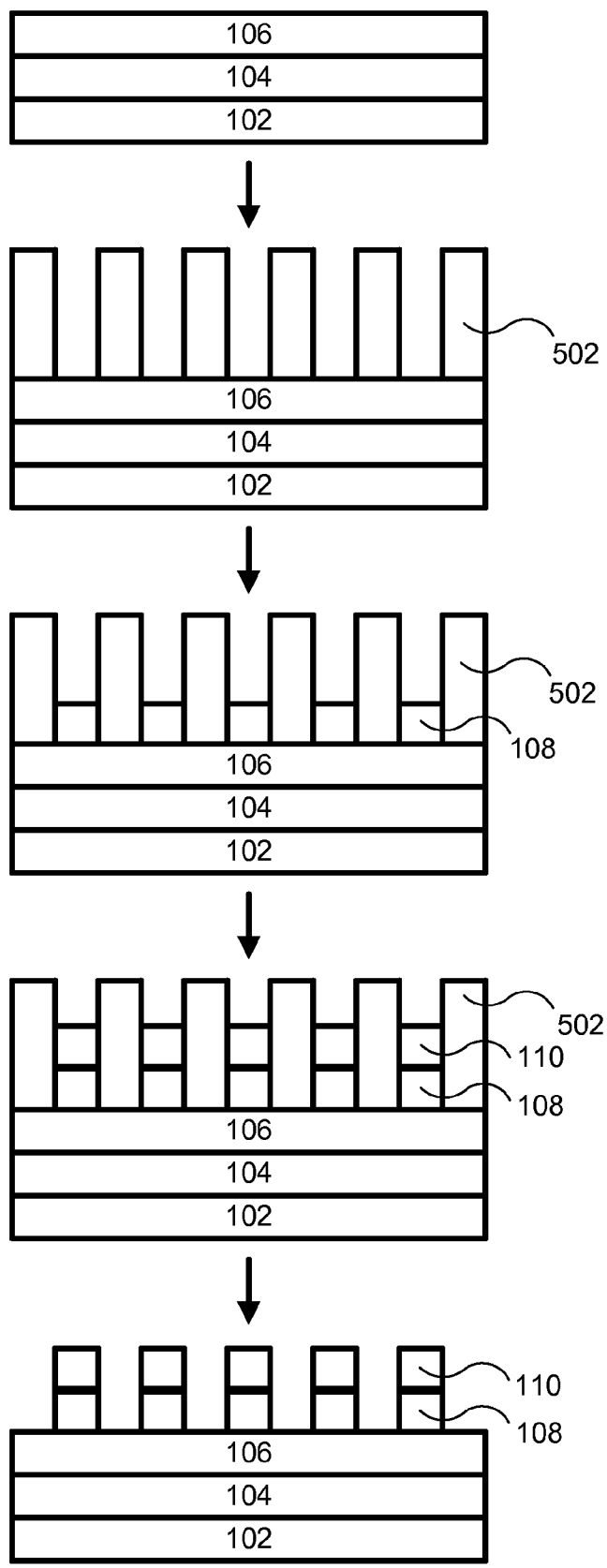
FIG. 5 is a flow describing a process for fabricating the vacuum grid electrode structure described herein.

In another embodiment, a method for fabricating an electrode-grid structure 100 is a substantially additive process as shown in FIG. 5. In this embodiment, a resist 502 is deposited and lithographically patterned on the electrode 106. The dielectric layer 108 is then deposited and fills in the open areas defined by the resist 502, and the etch mask 110 is deposited on the dielectric layer 108. The resist is then removed as the final step in this embodiment of the fabrication of the electrode-grid structure 100.

Figure 6:
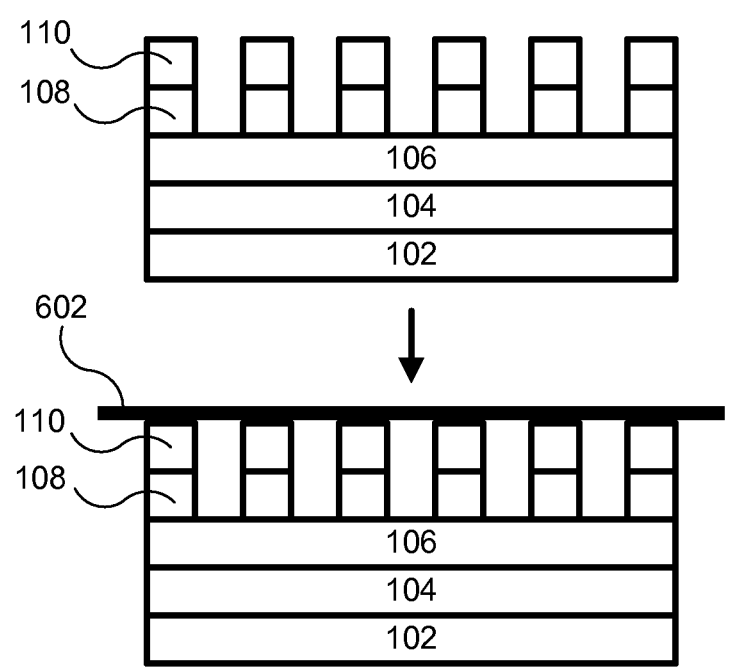
FIG. 6 is a flow describing a process for fabricating the vacuum grid electrode structure described herein.

In yet another embodiment of a method for fabricating an electrode-grid structure 100, shown in FIG. 6, the electrode-grid structure 100 is fabricated according to the steps as described with respect to FIG. 1, however in this embodiment the grid 602 is a self-supporting structure that is placed on top of the etch mask 110. The self-supporting grid 602 can be graphene, $MoS_2$, $WS_2$, a carbon nanotube mesh, or a different material, and can be floated on top of the etch mask 110 from solution or otherwise placed or deposited on top of the etch mask 110.

Figure 7:
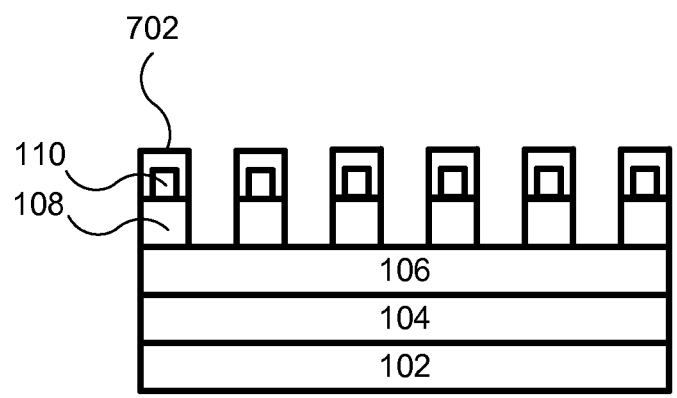
FIG. 7 is a schematic of vacuum grid electrodes having a dielectric coating on the grid.
Figure 7:
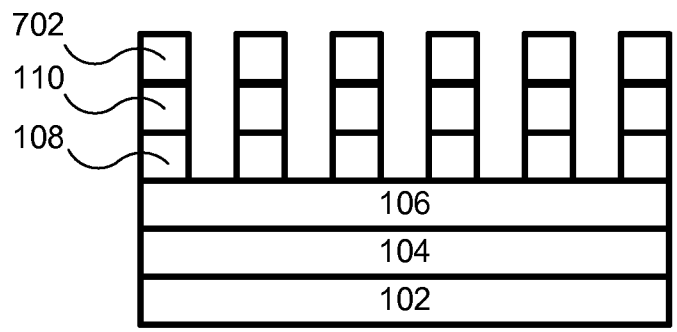

In some embodiments the grid (where, again, the grid can be the etch mask 110 as seen, for example, in FIGS. 1, 3, and 5) is at least partially oxidized and/or otherwise at least partially coated with a dielectric, i.e., the grid has a grid coating 702 as shown in FIG. 7. Such a grid coating can help device performance by (a) reducing charged particle absorption by the grid, and/or by (b) shielding the charged particles from the charge on the grid, and reducing unwanted influences on the charged particles' trajectories. In some embodiments the grid coating may be conformally coated on the grid, as shown in the top schematic of FIG. 7, or it may only be on the upper surface of the grid, as shown in the bottom schematic of FIG. 7. The grid coatings shown in FIG. 7 are exemplary embodiments, and in different embodiments the grid coating may cover more or less of the grid than is shown in FIG. 7. Further, the thickness of the grid coating may be different than that shown in FIG. 7.

In some embodiments the grid coating 702 is an oxide of a metal. In one embodiment the oxide is that of a metal that at least partially forms the grid, for example, where the grid includes aluminum (Al), the grid coating may be aluminum oxide. In another embodiment the oxide is that of a different material. Oxide coatings may include materials such as aluminum oxide (as previously mentioned), silicon oxide, silicon nitride, hafnium oxide, or a different material. The oxide may, in some embodiments, be formed or deposited via chemical, physical, or plasma-enhanced oxidation, annealing in an oxygen-containing atmosphere, atomic layer deposition, CVD, evaporation, sputtering, or via a different method.

The grid coating 702 may be performed as an additional step in any of the fabrication schemes described herein. For example, referring to FIG. 1, silicon nitride or another dielectric may be coated conformally on the etch mask 110. The silicon nitride above the etch mask 110 is then masked during the etch. The following etch step will etch the silicon nitride between portions of the etch mask but not on top of the etch mask. In another embodiment, referring to FIG. 3, an additional dielectric layer is deposited on the top of the etch mask 110 before it is patterned. This additional dielectric layer is then masked and etched, followed by the last two steps shown in FIG. 3. In another embodiment, referring to FIG. 5, another layer of dielectric is deposited on the etch mask 110. An alternative, since the etch mask 110 is supported by high aspect ratio pillars (the resist 502), involves deposition of a dielectric using a technique ill-suited to high aspect ratio structures (e.g. angled evaporation) such that the dielectric will stick to the tops of the pillars but not obstruct the surface of the electrode 106. As a final example, the structures shown in FIG. 7 might additionally be formed by oxidation (e.g. by exposure to an optionally directional oxygen-containing plasma, annealing in an oxygen-containing atmosphere, etc.) or reaction with another chemical (e.g. ammonia reacting with silicon to form silicon nitride) at any appropriate step of the above fabrication procedures, including after the final step. The dielectric thickness is variable.

Figure 8:
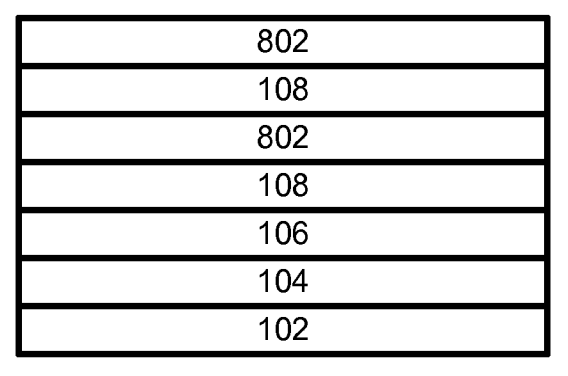

In some embodiments the electrode-grid structure includes two or more grids, as shown in FIG. 8. In such an embodiment the grids 802 are separated by a dielectric/insulating layer 108 and the resulting electrode-grid structure includes alternating layers of conductor (e.g. the grids) and dielectric/insulator (FIG. 8 also shows the substrate 102, adhesion layer 104, and electrode 106). The initial and final layers may be conductors (e.g. grids) or dielectrics/insulators.

The thicknesses of the conducting and dielectric/insulator layers and their material compositions may be selected according to a particular embodiment. In one embodiment, the dielectric/insulating layer 108 includes a piezoelectric or other size-tuneable structure, polymer, and/or molecule which can tune the spacing of the conductive grid layers 802 actively or passively with respect to each other or with respect to the electrode.

Fabrication of multi-grid structures is accomplished by performing the deposition/etching/lithography steps and other fabrication procedures that have been described herein in sequence. For example, in FIG. 3, to create a multi-grid structure, the first two steps would be repeated the desired number of times to produce the desired number of layers of dielectric/insulator layers 108 and grid layers 110. Lithography is used to define the grid structure, and finally alternating grid/dielectric etches are performed to define the multiple grid. Before such a process, the top grid layer is coated with a protective layer to protect it from the alternating grid/dielectric etches. In another embodiment, the grid layers are simply oxidized to produce the insulating layer between grid layers. In such an embodiment the deposition and oxidation could be performed in the same chamber, and passivation of the top layer and alternating etch chemistries would not be required since, in most cases, conductors and their oxides (e.g. Al and aluminum oxide) etch in the same (plasma) chemistry. As another example, in FIG. 5, multiple dielectric and grid layers are deposited to achieve a multiple layer grid structure.

Figure 9:
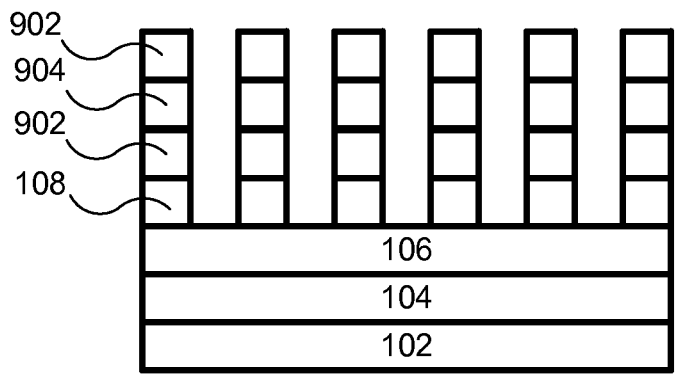
FIGS. 9 and 10 are schematics showing various embodiments of vacuum grid electrode structures having multiple grids.
Figure 9:
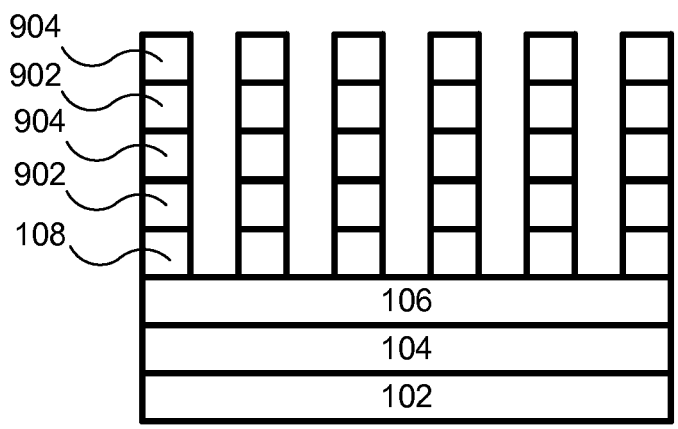
Figure 9:
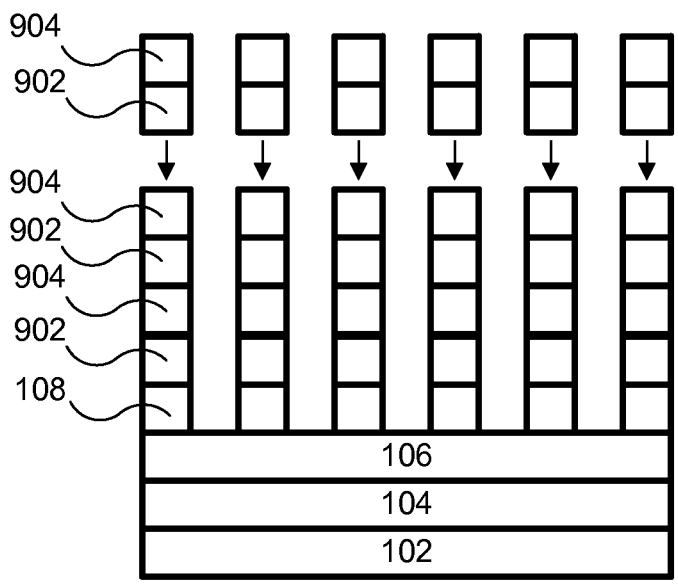
Figure 10:
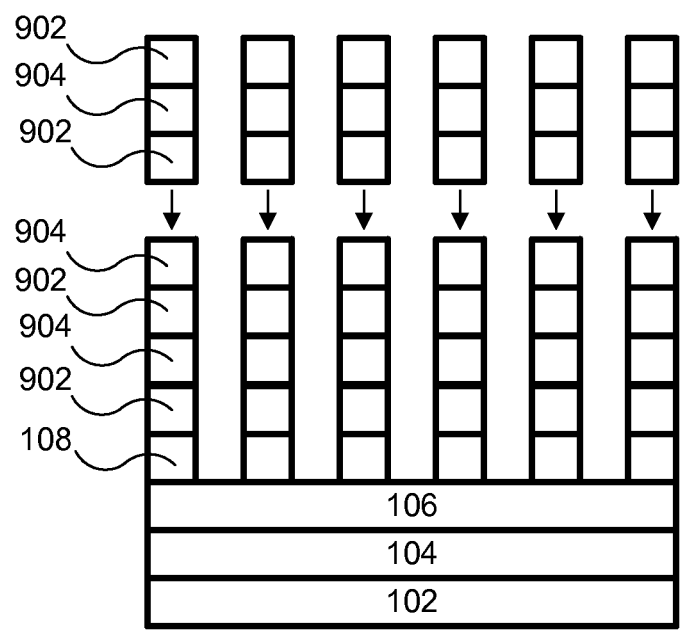
Figure 10:
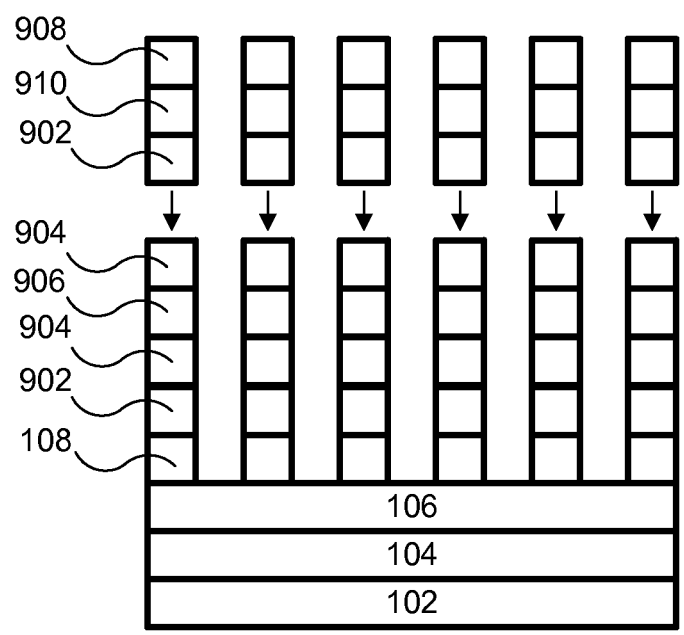

FIGS. 9 and 10 show various embodiments of electrode-grid structures having multiple grids. The top diagram of FIG. 9 shows an embodiment having a substrate 102, an adhesion layer 104, an electrode 106, a dielectric layer 108, and two grids 902 separated by a dielectric/insulator layer 904. The middle diagram of FIG. 9 shows an embodiment similar to that of the top diagram of FIG. 9, but with an additional layer of dielectric/insulator 904 on the top. The bottom diagram of FIG. 9 shows an embodiment similar to that of the middle diagram of FIG. 9, but with additional layers of grid 902 and insulator 904 added. The top diagram of FIG. 10 is similar to the bottom diagram of FIG. 9, but with an additional layer of dielectric/insulator 904 on the top. The bottom diagram of FIG. 10 shows that these layers of grids and dielectric/insulator do not necessarily all need to be the same material, as the grids 906 and 908 can be a different material than that of the grid 902, and the dielectric/insulator 910 can be different from that of dielectric/insulator 904.

Figure 11:
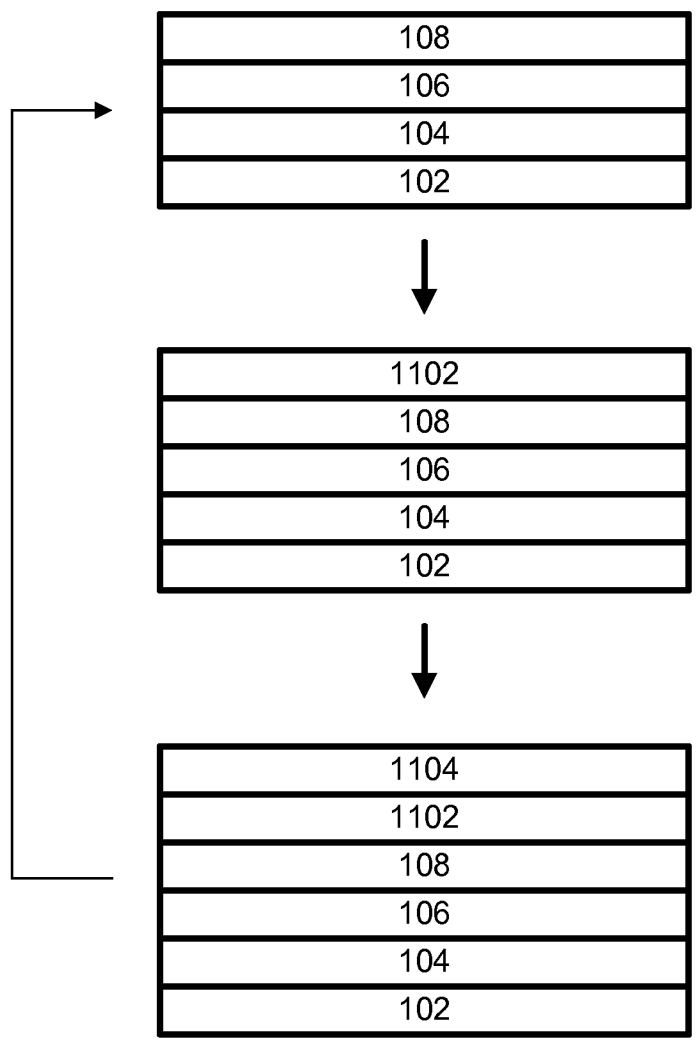
FIG. 11 is a flow describing a process for fabricating a vacuum grid electrode structure having multiple grids.

FIG. 11 is a flow diagram showing one embodiment of a process for creating a multi-layer structure with alternating layers of conductor 1102 and insulator 1104. First, the adhesion layer 104, electrode 106, and dielectric layer 108 are deposited on the substrate 102. The conductive layer 1102 is applied. The conductor 1102 is then oxidized to produce the dielectric/insulator layer 1104. This process can be repeated to create multiple alternating layers of conductor 1102 and dielectric/insulator 1104. The resulting structure is then etched as previously described herein.

Although the embodiments described herein include substrates, where the electrode is fabricated on the substrate, in some embodiments the electrode is fabricated without a substrate. For example, in some embodiments the electrode is an electropolished Mo, W, or $LaB_6$ wafer. In some embodiments an electron emissive material may be directionally deposited onto the electrode.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:
1. A multi-layer electrode-grid structure comprising:
   a substrate;
   a layer of a first material on the substrate, the layer of the first material forming an electrode;
   a layer of a second material on the first material, the second material including a dielectric; and a patterned layer of a third material on the second material, wherein the patterned layer of the third material forms a grid, the layer of a second material having a pattern defined by a pattern of the grid;

wherein the layer of a second material has a width and a height, the layer of a second material having a ratio of the height to the width between 2/1 and 50/1.

2. The multi-layer electrode-grid structure of claim 1 further comprising:

an adhesion layer that is between the substrate and the layer of the first material.

3. The multi-layer electrode-grid structure of claim 2 wherein the adhesion layer includes at least one of titanium and copper.

4. The multi-layer electrode-grid structure of claim 2 wherein the adhesion layer has a thickness, and wherein the thickness is substantially between 10 nm and 30 nm.

5. The multi-layer electrode-grid structure of claim 2 wherein the adhesion layer includes a material that is selected to improve adhesion of the first material to the substrate.

6. The multi-layer electrode-grid structure of claim 2 wherein the adhesion layer comprises three conductive layers, the three layers including two outer layers and one inner layer, wherein the two outer layers are in adhesive contact with at least one of the substrate and the layer of the first material and the one inner layer, wherein each of the two outer layers has a smaller thickness than the one inner layer.

7. The multi-layer electrode-grid structure of claim claim 6 wherein the two outer layers comprises titanium and the one inner layer comprises copper.

8. The multi-layer electrode-grid structure of claim 1 wherein the substrate includes a degenerately n++ arsenic (As) doped silicon (Si) wafer.

9. The multi-layer electrode-grid structure of claim 1 wherein the first material includes lanthanum hexaboride (LaB6).

10. The multi-layer electrode-grid structure of claim 1 wherein the second material includes at least one of silicon nitride ($Si_3N_4$), silicon oxide ($SiO_2$), aluminum oxide ($Al_2O_3$), and hafnium oxide ($HfO_2$).

11. The multi-layer electrode-grid structure of claim 1 wherein the grid includes electrical contacts.

12. The multi-layer electrode-grid structure of claim 1 further comprising a grid coating on the grid, and wherein the third material comprises a metal and the grid coating includes a dielectric comprising an oxide of the metal.

13. The multi-layer electrode-grid structure of claim 1 wherein the third material includes Aluminum (Al).

14. The multi-layer electrode-grid structure of claim 1 wherein the etched second material has a width and a height, and wherein the ratio of the height to the width is between 2/1 and 5/1.

15. The multi-layer electrode-grid structure of claim 1 wherein the etched second material has a width and a height, and wherein the ratio of the height to the width is between 5/1 and 20/1.

16. The multi-layer electrode-grid structure of claim 1 wherein the etched second material has a width and a height, and wherein the ratio of the height to the width is between 20/1 and 50/1.

17. The multi-layer electrode-grid structure of claim 1 wherein the first material includes at least one of cerium hexaboride ($CeB_6$), tungsten (W), and diamond.

18. The multi-layer electrode-grid structure of claim 1 further comprising a grid coating on the grid, and wherein the grid coating is coated conformally on the grid.

19. The multi-layer electrode-grid structure of claim 1 further comprising a grid coating on the grid, and wherein the grid coating is applied to an upper portion of the grid.

20. The multi-layer electrode-grid structure of claim 1, further comprising a self-supporting grid structure on the patterned layer of a third material.

21. The multi-layer electrode-grid structure of claim 20, wherein the self-supporting grid structure comprises a different grid pattern than that of the patterned layer of a third material.

22. The multi-layer electrode-grid structure of claim 20, wherein the self-supporting grid structure comprises a material selected from the group consisting of graphene, $MoS_2$, $WS_2$, and a carbon nanotube mesh.

* * * * *

UNITED STATES PATENT AND TRADEMARK OFFICE
CERTIFICATE OF CORRECTION

PATENT NO. : 10,026,822 B2
APPLICATION NO. : 14/939743
DATED : July 17, 2018
INVENTOR(S) : Max N. Mankin and Tony S. Pan Page 1 of 1

It is certified that error appears in the above-identified patent and that said Letters Patent is hereby corrected as shown below:

In the Claims

Column 9, Lines 30-31, Claim 7:
"electrode-grid structure of claim claim 6 wherein the two outer layers comprises titanium"
Should read:
--electrode-grid structure of claim 6 wherein the two outer layers comprise titanium--

Signed and Sealed this
Twenty-first Day of August, 2018

Andrei Iancu
*Director of the United States Patent and Trademark Office*